United States Patent
Murakamz et al.

(10) Patent No.: US 6,506,627 B1
(45) Date of Patent: Jan. 14, 2003

(54) SEMICONDUCTOR DEVICE, TAB TAPE FOR SEMICONDUCTOR DEVICE, METHOD OF MANUFACTURING THE TAB TAPE AND METHOD OF MANUFACTURING THE SEMICONDUCTOR DEVICE

(75) Inventors: Gen Murakamz, Tama (JP); Mamoru Mita, Hitachi (JP); Norio Okabe, Hitachi (JP); Yasuharu Kameyama, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 09/511,156

(22) Filed: Feb. 23, 2000

Related U.S. Application Data

(62) Division of application No. 09/124,012, filed on Jul. 29, 1998, now Pat. No. 6,323,058.

(30) Foreign Application Priority Data

Jul. 30, 1997 (JP) ............................................. 9-204424

(51) Int. Cl.[7] ................................................ H01L 21/44
(52) U.S. Cl. ........................ 438/118; 438/106; 438/108; 438/123
(58) Field of Search ................................. 438/106, 108, 438/123, 118; 257/666, 668, 678, 690, 734

(56) References Cited

U.S. PATENT DOCUMENTS

| | | | | |
|---|---|---|---|---|
| 4,912,547 A | * | 3/1990 | Bilowith et al. | 357/80 |
| 5,474,957 A | * | 12/1995 | Urushima | 437/209 |
| 5,602,059 A | * | 2/1997 | Horiuchi et al. | 437/209 |
| 5,672,912 A | * | 9/1997 | Aoki et al. | 257/693 |
| 5,801,434 A | * | 9/1998 | Sugahara | 257/668 |
| 5,814,880 A | * | 9/1998 | Costello et al. | 257/678 |
| 5,866,942 A | * | 2/1999 | Suzuki et al. | 257/698 |
| 5,990,545 A | * | 11/1999 | Schueller et al. | 257/697 |

OTHER PUBLICATIONS

"VLSI Packaging technology (the first vol.)" (May 1993), pp. 74–97.
"97 Symposium on New Technology of VLSI packaging", p. 126. hels on Mar. 3–4, 1997.

* cited by examiner

Primary Examiner—Michael Sherry
Assistant Examiner—Scott B. Geyer
(74) Attorney, Agent, or Firm—Antonelli, Terry, Stout & Kraus, LLP

(57) ABSTRACT

A structure of a semiconductor device of a chip scale package structure is provided. In the semiconductor device, the limitation to size reduction due to the bonding tool is small and the bonding pitch of the semiconductor chip can be reduced to 100 μm or less, and the chip shrink technique of a technique for lowering the cost can be employed and in connection with this compatibility among packages can be kept.

The semiconductor device includes a semiconductor chip; a TAB tape being directly laminated onto a circuit formed surface of the semiconductor chip or being laminated through a stress moderating elastomer onto the circuit formed surface of the semiconductor chip, the TAB tape having leads made of a metallic film formed on an insulator tape having flexibility; and an externally connecting member formed in an end of the lead of the TAB tape, wherein the TAB tape has holes in the insulator tape, each of the holes corresponding to a bonding pad formed on a circuit formed surface of the semiconductor chip at a position corresponding to a position of the bonding pad; the lead being formed so as to bridge across the hole; and the lead formed above the hole being joined to the bonding pad of the semiconductor chip.

28 Claims, 7 Drawing Sheets

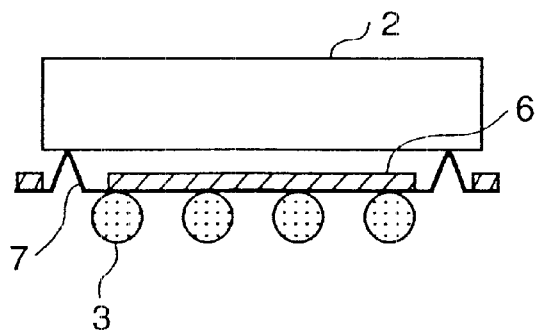 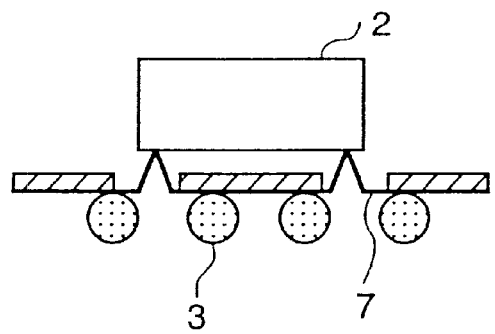
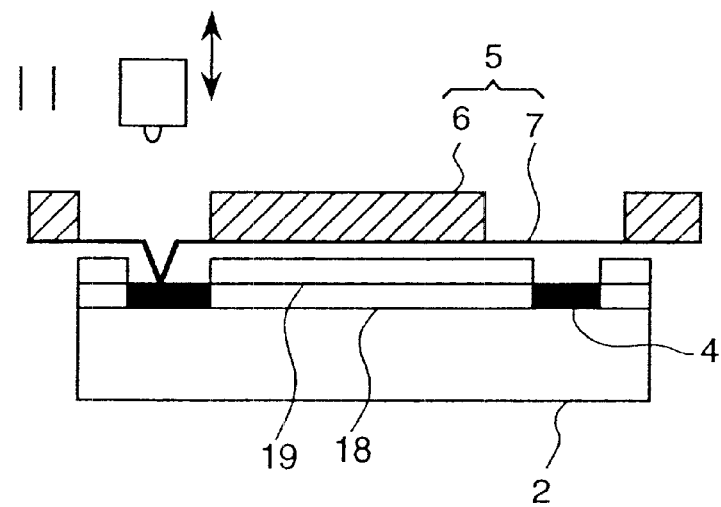

US 6,506,627 B1

SEMICONDUCTOR DEVICE, TAB TAPE FOR SEMICONDUCTOR DEVICE, METHOD OF MANUFACTURING THE TAB TAPE AND METHOD OF MANUFACTURING THE SEMICONDUCTOR DEVICE

This application is a Divisional application of prior application Ser. No. 09/124,012, filed Jul. 29, 1998 now U.S. Pat. No. 6,323,058.

BACKGROUND OF THE INVENTION

The present invention relates to a semiconductor device and a tape automated bonding (hereinafter, referred to as TAB) tape used in the semiconductor device and, more particularly, to a semiconductor device of a chip scale package (hereinafter, referred to as CSP) structure and a structure of a TAB tape used in the semiconductor device.

In packaging of a semiconductor device, a semiconductor device of a conventional lead on chip structure is widely employed as a basic structure of a 16M DRAM and so on because of high density mounting capability and high design freedom of a semiconductor chip and a semiconductor device. However, a bonding pad of a semiconductor chip such as a large scale integrated semiconductor circuit and an inner lead of a semiconductor device lead frame are connected with a bonding wire such as a gold wire or the like. According to this connecting method, that is, the ball bonding method by heat pressing using the bonding wire such as the gold wire or the like, it is difficult to reduce the pitch between the bonding pads below 100 $\mu$m and accordingly to limit the wiring design because of limitations in the size of a heating tool which forms a ball in a top end of the bonding wire by heating and in the size of a tool such as a capillary which holds and moves the bonding wire and press-bonds the ball formed in the top end of the bonding wire to the bonding pad of the semiconductor chip.

Further, the connecting method between the bonding pad of the semiconductor chip such as a large scale integrated circuit or the like and the lead of the TAB tape in the conventional TAB is performed by forming a vamp made of gold or the like in the bonding pad of the semiconductor chip, and tinning the corresponding metal lead to be connected through a gold-tin alloy bonding method (refer to "VLSI packaging technology (the first volume)", pp74–97, published by Nikkei PB Company). According to this method, it is possible to set the pitch between the bonding pads to 50 to 100 $\mu$m. However, since the vamps need to be formed in the pre-process of semiconductor pitch (micromachining of the wafer), there are problems in addition of processes and in price of the semiconductor device. Therefore, the method is not suitable for being applied to a package containing a semiconductor chip like a large scale integrated circuit of small batch production such as an ASIC device.

A method of face down connecting a semiconductor chip such as a large scale integrated circuit onto a ceramic board or the like by providing solder vamps on a bonding pad of the semiconductor chip is applied to a mass production process as a high integrated mounting technology in a super-computer field (refer to "'97 Symposium on New Technology of VLSI packaging", p126, held on Mar. 3–4, 1997, sponsored by the Society for Semiconductor Packaging Technology Study). This method has problems in that the solder bonding vamps need to be formed on the surface facing the semiconductor chip because the vamp pitch, that is, the bonding pitch is as wide as approximately 250 $\mu$m, and in that the cost becomes high because an alumina ceramic material having a linear thermal expansion coefficient near the linear thermal expansion coefficient of the silicon substrate forming the large scale integrated circuit must be used in order to moderate thermal stress acting on the bonding portions. The reason why the vamp pitch in this method is as wide as approximately 250 $\mu$m is that making of wiring formed on the ceramic substrate to be finer is more difficult than in the case of the TAB.

The semiconductor device 1' of a CSP structure called as $\mu$BGA (BGA: Ball Grid Array) structure as shown in FIG. 11, developed by TESSERA Inc., has a structure in which solder balls 3' as externally connected members are arranged in a region inside the periphery of a semiconductor chip 2'. According to this structure, as the size of the semiconductor chip 2' is decreased with progress of the micro-machining technology of the wafer, the pitch between the solder balls 3' as externally connected members needs to be reduced as shown in FIG. 13, as well as the pitch between bonding pads 4' of the semiconductor chip 2'. However, there is a disadvantage in that when the pitch P between the solder balls 3' is decreased, compatibility among packages cannot be maintained and wiring design of a print board needs to be changed.

Since the $\mu$BGA is widely used as a structure of a semiconductor device for a potable apparatus such as a flash memory or the like, it is strongly required to reduce size and cost of the semiconductor chip. The most widely employed method of reducing cost of a semiconductor chip is a chip shrink technique in which the size of the semiconductor chip is decreased using the wafer micro-machining technology to increase the number of chips obtained from one single wafer. FIG. 13A shows a feature before the chip shrinking, and FIG. 13B shows a feature after the chip shrinking. Further, the $\mu$BGA structure developed by TESSERA Inc. has a disadvantage in that it is difficult to employ the chip shrink technique in connection with the $\mu$BGA structure because there is the above-mentioned problem when the size of the semiconductor chip is decreased.

Furthermore, in the above-mentioned $\mu$BGA structure, the TAB tape 5' used for the member to construct the package is formed by making holes in an insulator tape 6' member made of polyimide or the like through press-working. Therefore, there is a limitation in machining of the micro-holes because it is difficult to make the micro-holes having a diameter as small as the size of the bonding pad, and there is a problem in that when a TAB tape of a three-layer structure having a bond between a metallic film and the insulator tape is used, the press-working of the inside surface of the holes squeezes out the bond from bonded edge portions.

In addition to the above, in the above-mentioned $\mu$BGA structure, an elastomer 8' having a length of approximately 100 $\mu$m is arranged between the semiconductor chip 2' and the TAB tape 5' as a thermal stress modulating member. However, according to this structure, in order to connect a metallic film lead 7' of the TAB tape to the bonding pad 4' of the semiconductor chip 2', the lead 7' needs to be formed so as to have an S-shaped bent portion depending on a level difference to the bonding pad 4'. In order to do so, a tool having a cross-shaped groove in the top end is used as the bonding tool for forming the lead in the S-shape to connect it. The lead 7' is bent toward the bonding pad 4' of the semiconductor chip 2' while the lead 7' is being held by the groove of the tool, and connected to the bonding pad by controlling so that the lead 7' is slightly moved in the horizontal direction to a desired position.

Therefore, from the problems caused from the structure and the operation of the bonding tool, it is difficult to bend and move the lead 7', to be wired in a slanting direction, in the horizontal direction toward the bonding pad 4' and to connect to the bonding pad, in a case where the bonding pads 4' are arranged in the corners of the semiconductor chip 2', as shown in FIG. 12. As a result, the bonding pads 4' cannot be arranged in the corners of the semiconductor chip 2', and accordingly it is difficult to decrease the pitch between the bonding pads 4'.

In addition to the above, in the above-mentioned μBGA structure, since the lead 7' to be connected to the bonding pad 4' of the semiconductor chip 2' in the TAB tape 5' is supported in a cantilever state from an edge portion of the insulator tape 6', the lead 7' itself needs to have a strength to a certain degree, and if not, there is caused a problem of strength that the lead 7' is easily deformed. Further, in a case where the surface of the lead 7' is plated with gold so as to be easily connected with the bonding pad 4', it is required to arrange an additional leading-out lead to be used for the gold plating which is connected to the lead 7'.

SUMMARY OF THE INVENTION

An object of the present invention is to provide a structure of the semiconductor device of a CSP structure in which the limitation by the bonding tool is small and the bonding pitch of the semiconductor chip can be reduced to 100 μm or less, and the chip shrink technique of a technique for lowering the cost can be employed, and, in connection with this, compatibility among packages can be kept.

Another object of the present invention is to provide a semiconductor device TAB tape used for manufacturing the above-mentioned semiconductor device and a useful method of manufacturing the TAB tape.

A still other object of the present invention is to provide a useful method of manufacturing the above-mentioned semiconductor device using the above-mentioned TAB tape.

The objects of the present invention described above can be attained by providing a semiconductor device comprising a semiconductor chip; a TAB tape being used by being directly laminated onto a circuit formed surface of the semiconductor chip or by being laminated through a stress moderating elastomer onto the circuit formed surface of the semiconductor chip, the TAB tape having leads made of a metallic film formed on an insulator tape having flexibility; and an externally connecting member formed in an end of the lead of the TAB tape, wherein the TAB tape has holes in the insulator tape, each of the holes corresponding to a bonding pad formed on a circuit formed surface of the semiconductor chip at a position corresponding to a position of the bonding pad; the lead being formed so as to bridge across the hole; the lead formed across the hole being joined to the bonding pad of the semiconductor chip.

Therein, in regard to the holes corresponding to the bonding pads, there are two cases where a hole is formed corresponding to each of a plurality of bonding pads formed on the circuit formed surface of the semiconductor chip and where a plurality of bonding pads are grouped and a hole is formed corresponding to the group of bonding pads. The both cases are within the scope of the present invention.

Further, the object of the present invention described above can be attained by providing a TAB tape for a semiconductor device being used by being directly laminated onto a circuit formed surface of the semiconductor chip or by being laminated through a stress moderating elastomer onto the circuit formed surface of the semiconductor chip, the TAB tape having leads made of a metallic film formed on an insulator tape having flexibility, which comprises holes in the insulator tape, each of the holes corresponding to a bonding pad formed on a circuit formed surface of the semiconductor chip at a position corresponding to a position of the bonding pad, the lead being formed so as to bridge across the hole.

Furthermore, the objects of the present invention described above can be attained by providing a method of manufacturing a TAB tape for a semiconductor device being used by being directly laminated onto a circuit formed surface of the semiconductor chip or by being laminated through a stress moderating elastomer onto the circuit formed surface of the semiconductor chip, the TAB tape having leads made of a metallic film formed on an insulator tape having flexibility, the method comprising the steps of preparing a tape member having metallic films formed on both surfaces of an insulator tape having flexibility; etching the metallic film formed on one side of the tape member to partially expose the insulator tape at least at positions corresponding to bonding pads formed on the circuit formed surface of the semiconductor chip; laser processing the exposed portions of the insulator tape to form holes corresponding to the bonding pads in the insulator tape at the positions corresponding to the bonding pads; and etching the metallic film formed on the other side of the tape member to form the lead so as to bridge across the hole.

Furthermore, the objects of the present invention described above can be attained by providing a method of manufacturing a semiconductor device, the method comprising the steps of preparing a semiconductor chip and a TAB tape for a semiconductor device being used by being directly laminated onto a circuit formed surface of the semiconductor chip or by being laminated through a stress moderating elastomer onto the circuit formed surface of the semiconductor chip, the TAB tape having leads made of a metallic film formed on an insulator tape having flexibility, and having holes formed in the insulator tape, each of the holes corresponding to a bonding pad formed on a circuit formed surface of the semiconductor chip at a position corresponding to a position of the bonding pad, the lead being formed so as to bridge across the hole; positioning the bonding pads of the semiconductor chip to the holes of the TAB tape for the semiconductor device; and pushing and jointing the lead formed across the hole onto the bonding pad of the semiconductor chip.

BRIEF DESCRIPTION OF THE DRAWINGS

These and other objects, features and advantages of the present invention will be understood more clearly from the following detailed description with reference to the accompanying drawings.

FIG. 1A is the plan view and FIG. 1B is the cross-sectional view being taken on the plane of the line A–A' of FIG. 1A;

FIG. 3A and FIG. 3B are views showing packaging states before shrinking of a semiconductor chip (FIG. 3A) and after shrinking (FIG. 3B) of a semiconductor device in accordance with the present invention;

FIG. 4 is a cross-sectional view showing another connecting state of a semiconductor chip and a lead of a TAB tape;

DESCRIPTION OF PREFERRED EMBODIMENTS

Figure 1A:
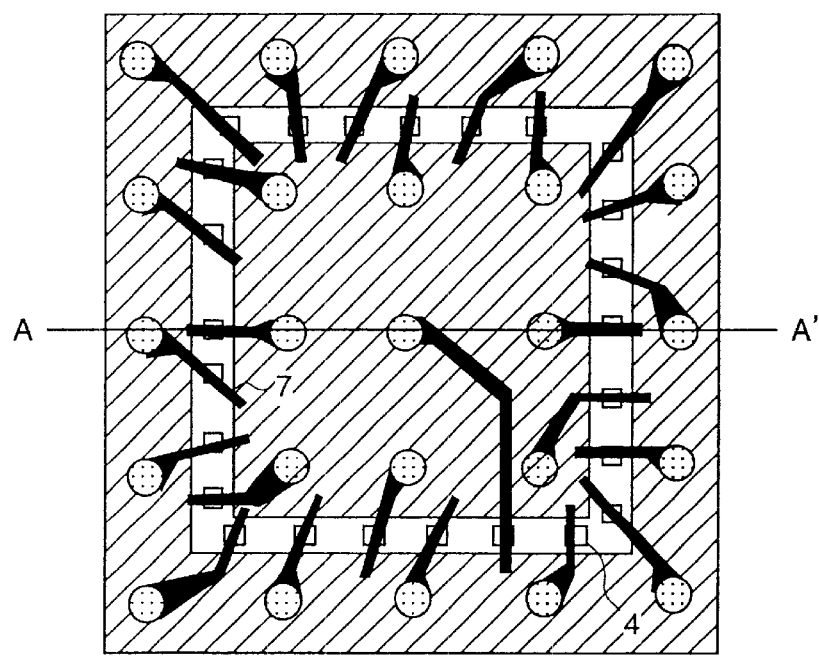
FIG. 1A and FIG. 1B are schematic views showing an embodiment of a semiconductor device in accordance with the present invention.

Embodiments of a semiconductor device, a TAB tape for a semiconductor device, a method of manufacturing the TAB tape and a method of manufacturing the semiconductor device in accordance with the present invention will be described below, referring to the accompanying figures.

In the figures, parts having the same function are identified by the same reference character, and repeating of the explanation will be omitted.

Figure 1B:
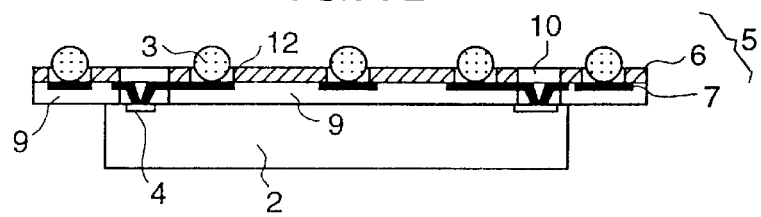

FIG. 1A and FIG. 1B are schematic views showing embodiments of a semiconductor device and a TAB tape for a semiconductor device in accordance with the present invention, and FIG. 1A is the plan view and FIG. 1B is the cross-sectional view being taken on the plane of the line A–A' of FIG. 1A. The semiconductor device is a so-called BGA type semiconductor device which has a CSP structure and has solder balls 3 as externally connecting means which are to be used as mounting terminals to a print board.

In FIG. 1A and FIG. 1B, the reference character 2 is a semiconductor chip such as a flash memory, and the circuit formed surface of the semiconductor chip is provided with a plurality of bonding pads 4 on the surface of which aluminum vapor deposited films are formed. The reference character 5 is a TAB tape which is constructed by forming metallic film leads 7 made of copper films having a thickness of 10 to 40 μm in patterned shapes on an insulator tape 6 made of polyimide having a thickness of 10 to 50 μm, and is bonded onto the circuit formed surface of the semiconductor chip 2 except for portions of the bonding pads 4 with a sheet-shaped bonding member 9. The sheet-shaped bonding member 9 may be attached at desired positions of the TAB tape 5 in advance. Further, the TAB tape 5 is constructed by forming a hole 10, corresponding to the group of the plurality of bonding pads 4 formed on the circuit formed surface of the semiconductor chip 2 for the plurality of bonding pads, in the insulator tape 6 in a frame-shape, and by forming leads 7 so as to bridge across the hole 10 through etching. A dimension, particularly, a width of the lead 7 is formed to be smaller than a dimension of the bonding pad 4 of a portion corresponding to the width of the lead. A lead for electroplating is connected to the lead 7.

The lead 7 in FIG. 1B is placed on the lower surface of the insulator tape 6 and formed so as to bridge across the hole 10, but the lead 7 is sometimes placed on the upper surface of the insulator tape 6 and formed so as to bridge across over the hole 10. By forming the lead 7 in such a manner, the lead 7 in a state of being overhung above the hole 10 is supported at both ends by the insulator tape 6 in order to be connected to the bonding pad 4. Therefore, the structure of the lead 7 is advantageous in the viewpoint of strength, and accordingly it is possible to reduce the thickness of the lead 7 by that degree or to use a soft copper film.

Figure 2:
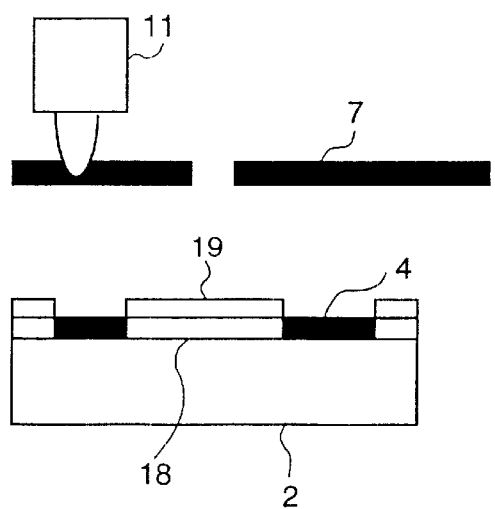
FIG. 2 is a cross-sectional view showing a connecting state of a semiconductor chip and a lead of a TAB tape.

In the semiconductor device 1, connection between the lead 7 formed above the hole 10 of the TAB tape 5 and the bonding pad 4 of the semiconductor chip 2 is performed using a bonding tool 11 as shown in FIG. 2 by bending the lead 7 in a V-shape to push it onto the bonding pad 4 and by directly bonding both to each other through an ultrasonic heat-press bonding method. The insulator tape 6 of the TAB tape 5 is not shown in FIG. 2. In this case, when a high purity copper (above 99.99% purity) is used for the material of the lead 7 as the soft copper having a high malleability and a high electric conductivity, the lead 7 can be directly connected onto the bonding pad 4 without damaging the semiconductor chip 2 at the time when both are bonded to each other. Further, when a gold plated layer 12 having a thickness of 0.1 to 0.3 μm is formed on the surface of the lead 7, the lead can be easily bonded with the bonding pad 4 having an aluminum vapor deposited film on the surface. As shown in FIG. 2, an insulator film 18 such as $SiO_2$, PSIN or the like and a polyimide film 19 are formed all over the circuit formed surface of the semiconductor chip 2 except for the portions of the bonding pads 4.

Further, in the semiconductor device 1 of this structure, since the connection described above can be performed only by pushing the lead 7 using the bonding tool 11 and without gripping the lead 7, there is no need to use a large-sized bonding tool such as a conventional capillary or the like. Accordingly, the pitch between the bonding pads in the semiconductor chip can be decreased since the limitation caused by the dimension of the bonding tool is eliminated. FIG. 3A shows a packaging state before shrinking of a semiconductor chip and FIG. 3B shows a state after shrinking of a semiconductor device. The pitch between the bonding pads can be decreased, for example, below 100 μm. In this case, in order to push the lead 7 toward an appropriate position in the bonding pad 4 of the semiconductor chip 2 by preventing slipping, it is preferable that the friction coefficient of the top end of the bonding tool is increased. Further, in order to make the connection easy by increasing the ultrasonic effect, it is preferable that the shape of the top end of the bonding tool 11 is formed in a horn-shape so as to increase energy of the ultrasonic wave.

At the time of performing the bonding described above, the dimensions of the bonding pad 4 of the semiconductor chip 2 and the lead 7 are accurately measured using a CCD camera and then both are bonded to each other. By doing so, the lead 7 can be accurately positioned and bonded onto the bonding pad 4 of the semiconductor chip 2. Therein, the accuracy of positioning both is smaller than 20 μm. FIG. 4 shows a state before bonding the bonding pad 4 and the lead 7 and a state after bonding both to each other. The state before bonding both to each other is shown in the right hand side of FIG. 4, and the state after bonding is shown in the left hand side. At the time of performing the bonding, the lead 7 is bent and deformed in the V-shape by the bonding tool 11.

After being bonded, the bonded portion is resin-sealed with epoxy resin or the like, not shown.

Then, the solder ball 3 is formed at an end of the lead 7 to complete the semiconductor device. The solder balls 3 may be pre-arranged in the TAB tape 5 in a stage of processing the TAB tape 5.

Figure 5:
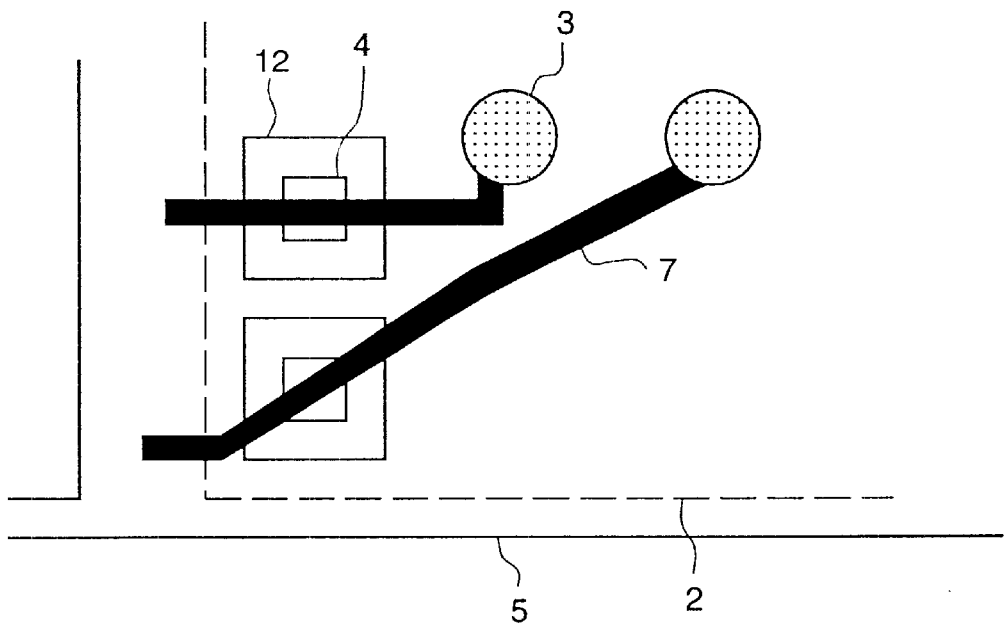
FIG. 5 is a schematic plan view showing another embodiment of a semiconductor device in accordance with the present invention.

FIG. 5 is a view showing another embodiment of a semiconductor device and a TAB tape for a semiconductor device in accordance with the present invention. In this semiconductor device, the TAB tape 5 has small holes 12 respectively corresponding to the bonding pads 4 formed on the circuit formed surface of the semiconductor chip 2, in the insulator tape 6. The hole 12 and the bonding pad 4 are similar in shape, and the dimension of the hole is slightly larger than the dimension of the corresponding portion of the bonding pad 4. Such a small hole 12 can be easily formed using a carbon dioxide gas laser.

Figure 6:
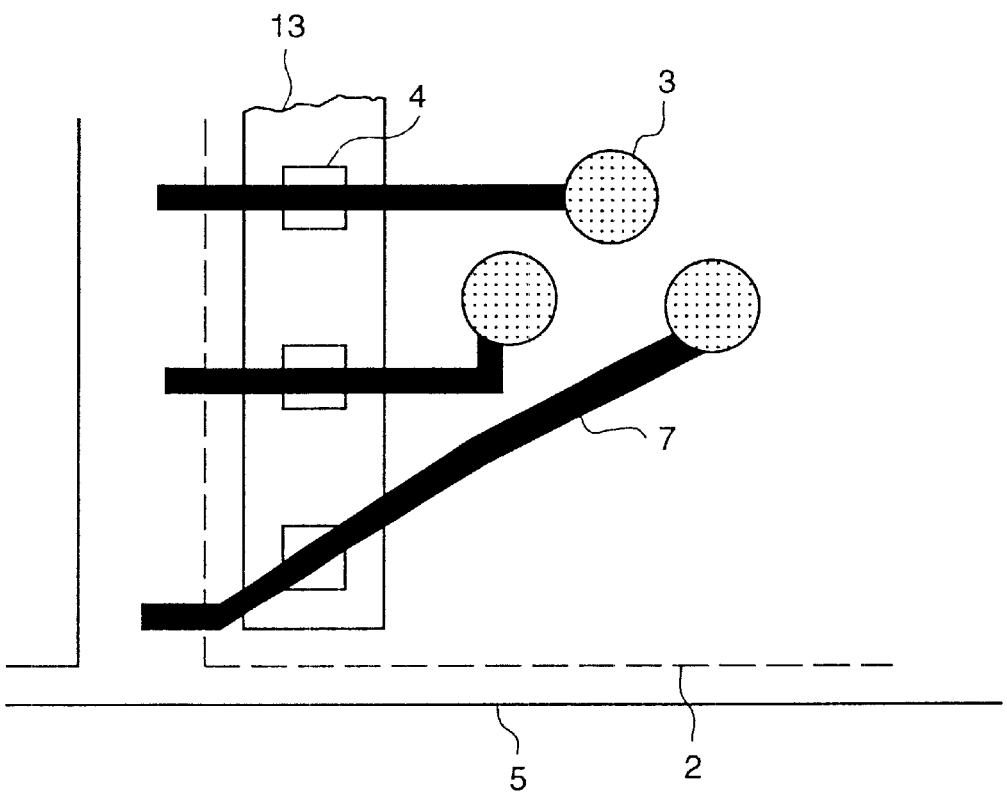
FIG. 6 is a schematic plan view showing a further embodiment of a semiconductor device in accordance with the present invention.

FIG. 6 is a view showing a further embodiment of a semiconductor device and a TAB tape for a semiconductor device in accordance with the present invention. In this semiconductor device 1, a plurality of bonding pads 4 formed on the circuit formed surface of the semiconductor chip 2 is classified into a plurality of groups, and a long hole 13 corresponding to each of the plurality of bonding pad groups is formed. In this case, the dimension of the hole 13 is also slightly larger than the dimension of the corresponding portion of the bonding pad 4.

Figure 7:
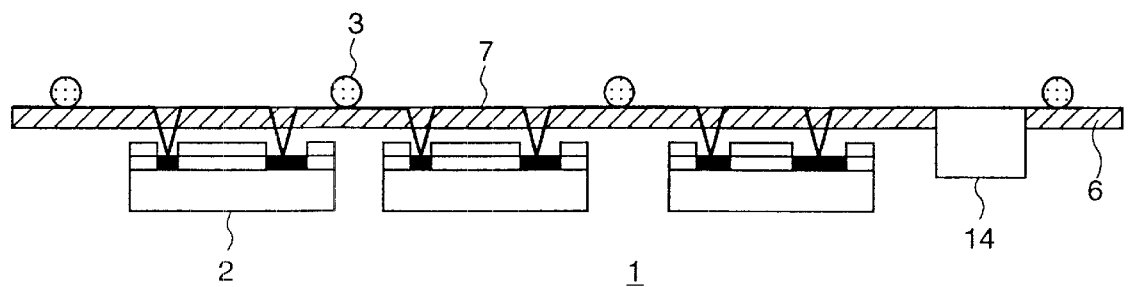
FIG. 7 is a schematic plan view showing a still further embodiment of a semiconductor device in accordance with the present invention.

In the semiconductor devices 1 in accordance with the present invention described above, the leads 7 formed on the insulator tape 6 are arranged so as to be on the side of the insulation tape adjacent to the circuit formed surface of the semiconductor chip 2. However, the leads 7 formed on the insulator tape 6 may be arranged so as to be on the side of the insulator tape opposite to the side adjacent the circuit formed surface of the semiconductor chip 2, as shown in FIG. 7 as another embodiment in accordance with the present invention. Further, active elements 14 such as resistors, capacitors, inductors and so on may be mounted together with the plurality of semiconductor chips 2.

Figure 8:
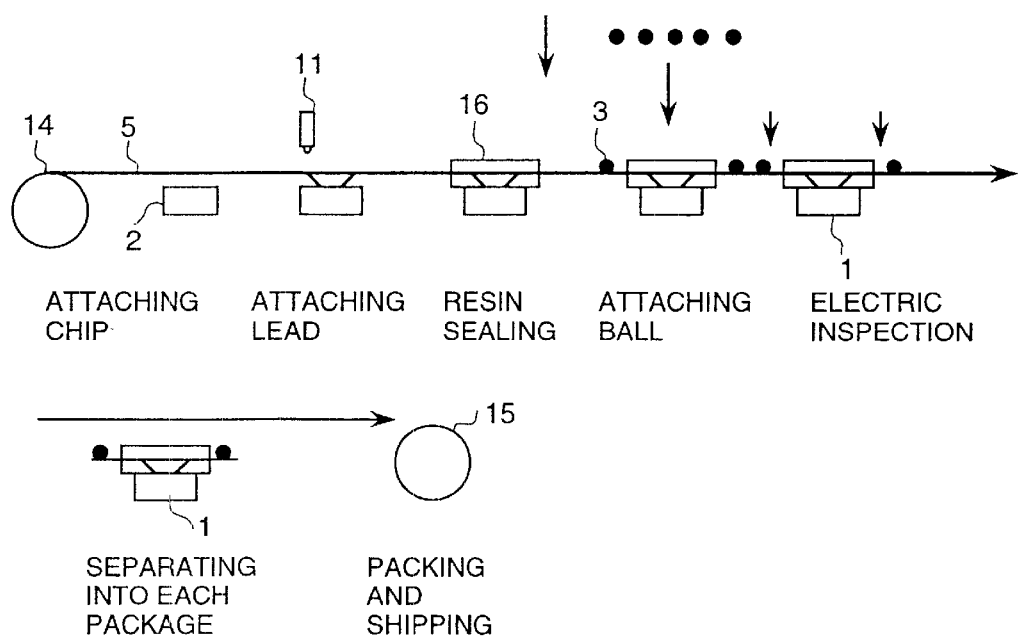
FIG. 8 is a schematic cross-sectional view showing a method of manufacturing a semiconductor device in accordance with the present invention by a continuous process.

FIG. 8 shows an embodiment of a method of manufacturing a semiconductor device in accordance with the present invention by a continuous process. Referring to this figure, the long TAB tape 5 in a state of being wound in a coil-shape is continuously let out from a sending-out unit 14, and the semiconductor chips 2 are attached onto predetermined positions of the TAB tape 5 with an adhering member. After that, the leads 7 formed on the TAB tape 5 are directly connected to the bonding pads of the semiconductor chip 2 using the bonding tool 11, and the solder balls 3 are formed on ends of the leads 7 after the bonded portions are resin-sealed 16. After that, electric inspection is performed in this state using a contact probe, and the long TAB tape 5 mounting the semiconductor devices is wound in using a winding unit 15 to be packed for shipping. Otherwise, after the electric inspection using the contact probe, the long TAB tape 5 mounting the semiconductor devices may be cut and separated into unit package to be packed and shipped.

Figure 9:
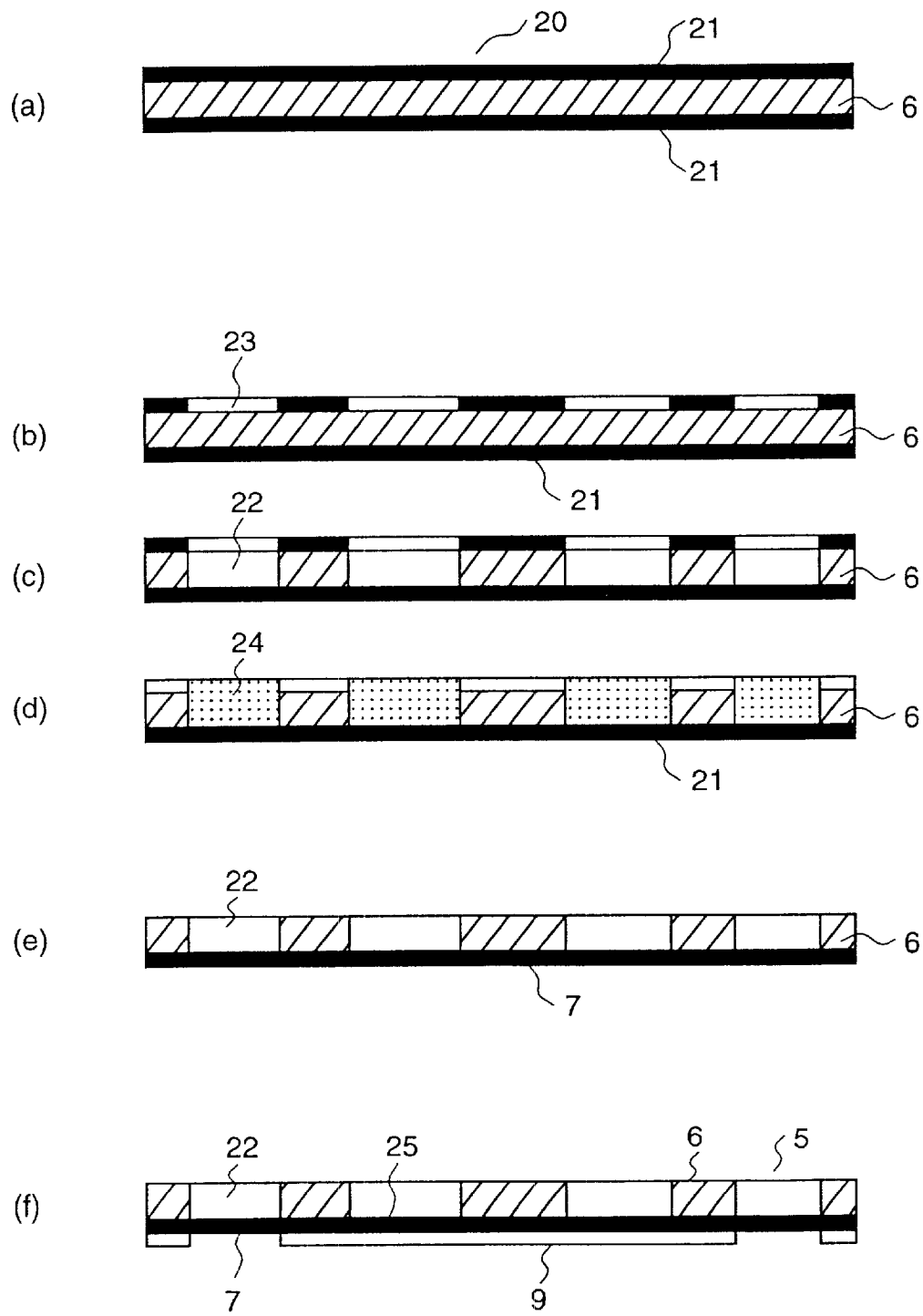
FIG. 9 is a view showing an embodiment of a method of manufacturing a TAB tape for a semiconductor device in accordance with the present invention.

FIG. 9 shows an embodiment of a method of manufacturing a TAB tape 5 for a semiconductor device used for the above-mentioned semiconductor device 1 in accordance with the present invention. The TAB tape 5 for a semiconductor device is used by laminating on the circuit formed surface of the semiconductor chip 2.

According to the manufacturing method, initially, as shown in FIG. 9(a), a tape member 20 of a three-layer structure is prepared by forming copper films of 18 $\mu$m thickness as the metallic films 21 respectively on both sides of the insulator tape 6 made of polyimide of 25 $\mu$m thickness. Then, as shown in (b), by photo-etching the metallic film 21 formed on one side of the tape member 20, the insulator tape 6 at positions corresponding to the bonding pads 4 formed on the circuit formed surface of the semiconductor chip 2 and corresponding to the land portions 25 to be formed with the solder balls 3, is partially exposed.

After that, as shown in FIG. 9(c), by etching the exposed portions 23 of the insulator tape 6 using the carbon dioxide gas laser, the small holes 22 are formed at the corresponding positions described above in the insulator tape 6. In this case, the metallic film at positions other than the exposed portions 23 of the insulator tape 6 is used as the mask to the laser. In order to obtain the accuracy of the hole, it is preferable to used the carbon dioxide gas laser since the hole 22 corresponding to the bonding pad 4 is as small as approximately 100 $\mu$m.

Next, as shown in FIG. 9(d), the hole 22 is filled with an etching resist material 24. Then, as shown in FIG. 9(e), all the remaining metallic film 21 formed on the one surface is removed, and the metallic film 21 formed on the other surface is etched. Particularly to the hole 22 corresponding to the bonding pad 4, the lead 7 is formed in a pattern shape so as to bridge across the hole 22. Thus, the TAB tape 5 for a semiconductor device is completed, for the time being. Finally, as shown in FIG. 9(f), in order to make bonding with the semiconductor chip 2 easy, a sheet-shaped adhering member 9 is attached in advance at a position where the semiconductor chip 2 is to be bonded.

Figure 10:
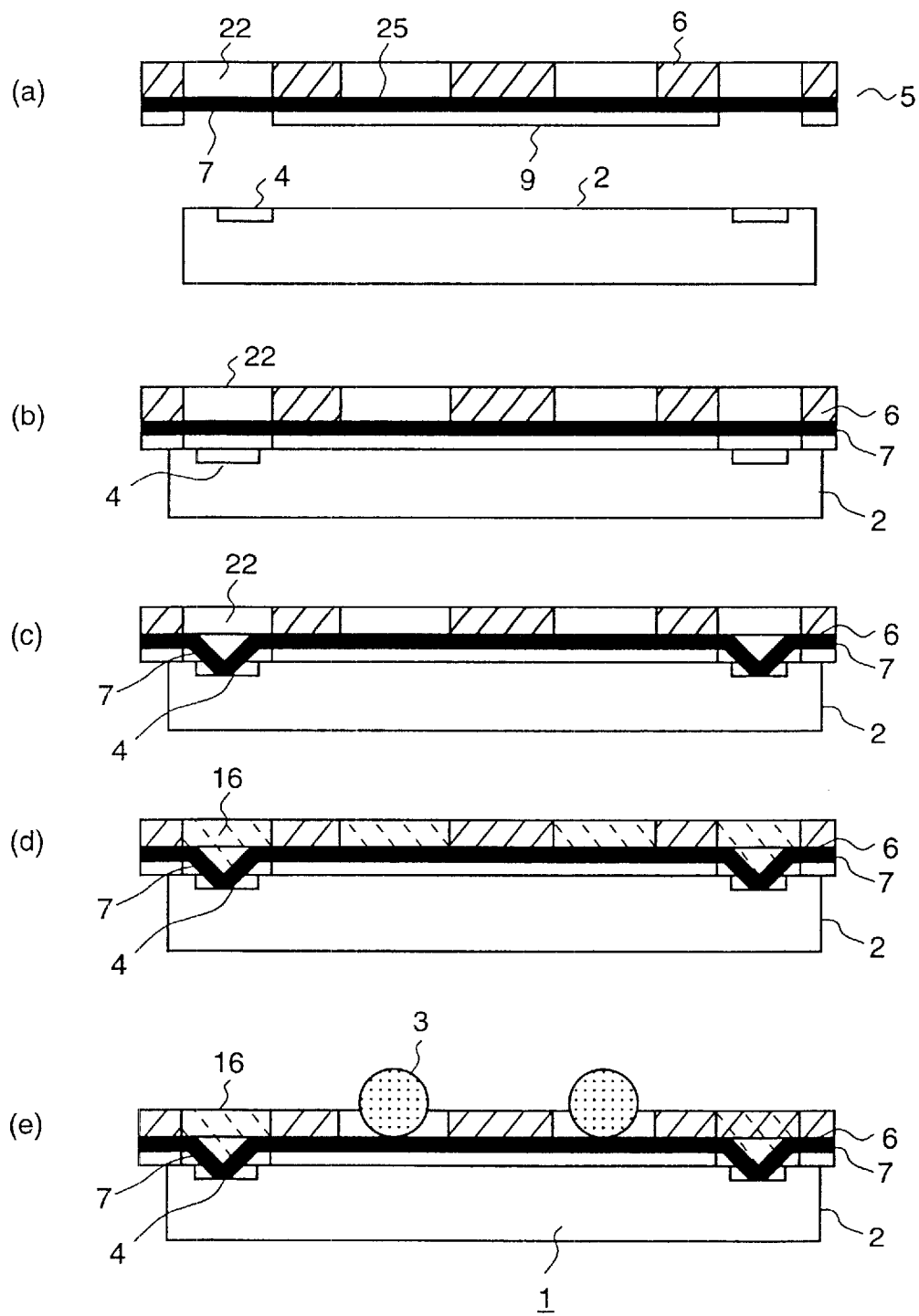
FIG. 10 is a view showing an embodiment of a method of manufacturing a semiconductor device in accordance with the present invention.
Figure 11:
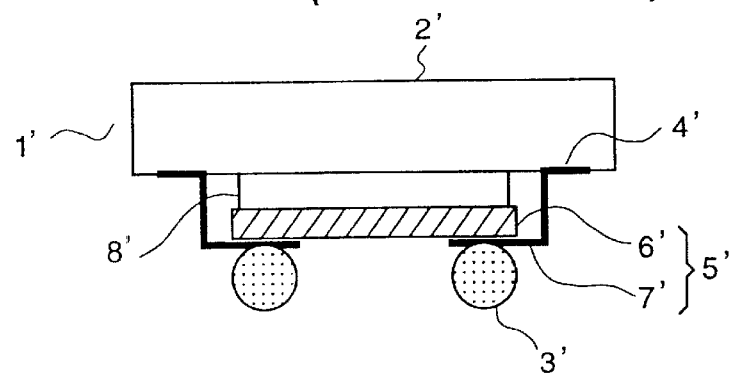
FIG. 11 is a schematic cross-sectional view showing a semiconductor device of a conventional CSP structure.
Figure 12:
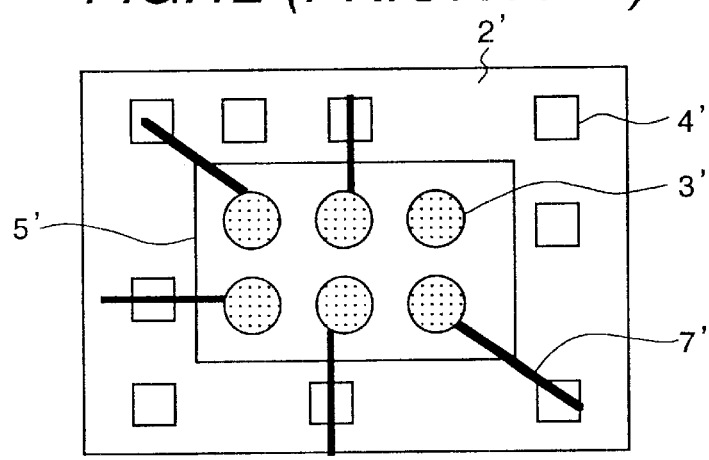
FIG. 12 is a schematic plan view explaining a problem in a semiconductor device of a conventional CSP structure.
Figure 13A:
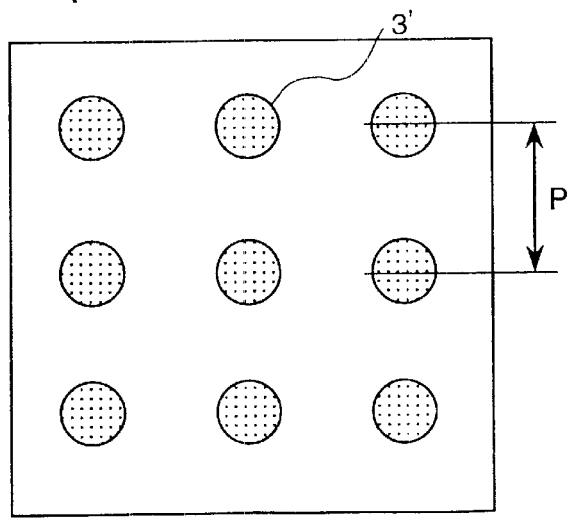
FIG. 13A and FIG. 13B are schematic plan views showing another problem in a semiconductor device of a conventional CSP structure.
Figure 13B:
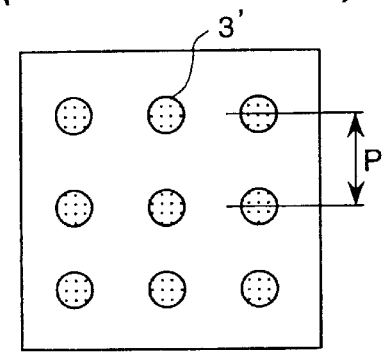

FIG. 10 shows an embodiment of a method of manufacturing a semiconductor device in accordance with the present invention using the TAB tape 5 for a semiconductor device manufacture as described above. That is, as shown in FIG. 10(a), a semiconductor chip 2 having a plurality of bonding pads 4 formed on the circuit formed surface and a TAB tape 5 for a semiconductor device manufactured as described above are prepared. Next, as shown in FIG. 10(b), the semiconductor chip 2 and the TAB tape 5 for the semiconductor device are bonded together with the sheet-shaped adhering member 9 attached onto the TAB tape 5 for the semiconductor device in advance. When the semiconductor chip 2 is bonded on the TAB tape 5, it is important that the lead 7 formed in the hole 22 of the insulator tape 6 of the TAB tape 5 for the semiconductor device is accurately positioned to the position of the bonding pad 4 of the semiconductor chip 2. This positioning is performed using the CCD camera as previously described.

Then, as shown in FIG. 10(c), the lead 7 formed so as to bridge across the hole 22 of the insulator tape 6 is pushed toward the bonding pad 4 of the semiconductor chip 2 so as to be formed in a V-shape using the bonding tool, not shown, and both are directly bonded to each other through the ultrasonic heat-press bonding method. Further, as shown in FIG. 10(d), the bonded portion is resin-sealed 16 with epoxy resin. Then, as shown in FIG. 10 (e), the solder ball 3 is mounted on the land portion for forming the solder ball 3 formed at one end of the lead 7 to complete the semiconductor device 1.

As having been described above, according to the semiconductor device, the TAB tape for semiconductor device, the method of manufacturing the semiconductor device and the method of manufacturing the semiconductor device in accordance with the present invention, since the limitation by the bonding tool is small and the bonding pitch of the semiconductor chip can be reduced to 100 $\mu$m or less, the semiconductor device of a CSP structure can be easily manufactured. Further, since the chip shrink technique of a technique for lowering the cost can be employed, there is an advantage in industrial applications and in connection with this, there is an effect in that compatibility among packages can be kept.

What is claimed is:

1. A method of manufacturing a TAB tape for a semiconductor device, said TAB tape being adapted to be laminated either directly or through a stress moderating elastomer onto a circuit formation surface of a semiconductor chip, said TAB tape including an insulator tape having flexibility and formed on said insulator tape are leads made of a metallic film, the method comprising the steps of:

providing a tape member having metal films formed on both sides of said insulator tape having flexibility;

etching the metal film formed on one side of said tape member to partially expose said insulator tape at least at positions corresponding to bonding pads formed on said circuit formation surface of said semiconductor chip;

laser processing the exposed portions of said insulator tape to form holes, corresponding to said bonding pads, in said insulator tape at said positions corresponding to said bonding pads; and etching the metal film formed on the other side of said tape member to form said leads so as to bridge across said holes, corresponding to said bonding pads, in said insulator tape.

2. A method of manufacturing a TAB tape for a semiconductor device according to claim 1, wherein at least a width of a lead formed across said hole is smaller than a dimension of a portion of a bonding pad on said circuit formed surface corresponding to the width of said lead.

3. A method of manufacturing a TAB tape for a semiconductor device according to claim 2, wherein a hole and a corresponding bonding pad have corresponding shapes.

4. A method of manufacturing a TAB tape for a semiconductor device according to claim 3, wherein a dimension of said hole is larger than a dimension of said bonding pad.

5. A method of manufacturing a TAB tape for a semiconductor device according to claim 4, wherein said metallic films are made of a soft copper film.

6. A method of manufacturing a TAB tape for a semiconductor device according to claim 5, wherein said leads have a gold plated layer having a thickness of at least 0.1 $\mu$m on a surface of said leads.

7. A method of manufacturing a TAB tape for a semiconductor device according to claim 6, wherein externally connecting members, made of solder balls, are formed on ends of the leads.

8. A method of manufacturing a TAB tape for a semiconductor device according to claim 1, wherein a hole and a corresponding bonding pad have corresponding shapes.

9. A method of manufacturing a TAB tape for a semiconductor device according to claim 8, wherein a dimension of said hole is slightly larger than a dimension of said bonding pad.

10. A method of manufacturing a TAB tape for a semiconductor device according to claim 1, wherein said metallic film is made of a soft copper film.

11. A method of manufacturing a TAB tape for a semiconductor device according to claim 1, wherein said lead has a gold plated layer having a thickness of at least 0.1 $\mu$m on a surface of said lead.

12. A method of manufacturing a TAB tape for a semiconductor device according to claim 1, wherein externally connecting members, made of solder balls, are formed on ends of the leads.

13. A method of manufacturing a TAB tape for a semiconductor device according to claim 1, wherein each of said leads bridging across said holes is supported at both ends by said tape member.

14. A method of manufacturing a semiconductor device, the method comprising the steps of:

providing a semiconductor chip and a TAB tape for a semiconductor device, said TAB tape being laminated onto a circuit formed surface of said semiconductor chip, said TAB tape including an insulator tape and having leads made of a metallic film formed on said insulator tape, said TAB tape having holes formed in the insulator tape, each of the holes corresponding to a bonding pad formed on said circuit formed surface of said semiconductor chip at a position corresponding to a position of said bonding pad, a lead, of said leads, being formed so as to bridge across said hole;

positioning bonding pads of the semiconductor chip to said holes formed in the insulator tape; and pushing and jointing said lead formed across said hole onto said bonding pad of the semiconductor chip.

15. A method of manufacturing a semiconductor device according to claim 14, wherein at least a width of said lead formed above said hole is smaller than a dimension of a portion of said bonding pad corresponding to the width of said lead.

16. A method of manufacturing a semiconductor device according to claim 15, wherein said hole and said bonding pad correspond in shape.

17. A method of manufacturing a semiconductor device according to claim 16, wherein a dimension of said hole is larger than a corresponding dimension of said bonding pad.

18. A method of manufacturing a semiconductor device according to claim 17, wherein said metallic film is made of a soft copper film.

19. A method of manufacturing a semiconductor device according to claim 18, wherein said lead has a gold plated layer having a thickness of at least 0.1 $\mu$m on a surface of said lead.

20. A method of manufacturing a semiconductor device according to claim 19, wherein an externally connecting member, made of a solder ball, is provided on an end of said lead.

21. A method of manufacturing a semiconductor device according to claim 20, wherein elements selected from the group consisting of resistors, capacitors, inductors and at least one other semiconductor chip, in addition to said semiconductor chip, are electrically connected to said leads.

22. A method of manufacturing a semiconductor device according to claim 14, wherein said hole and said bonding pad are similar in shape.

23. A method of manufacturing a semiconductor device according to claim 22, wherein a dimension of said hole is slightly larger than a dimension of said bonding pad.

24. A method of manufacturing a semiconductor device according to claim 14, wherein said metallic film is made of a soft copper film.

25. A method of manufacturing a semiconductor device according to claim 14, wherein said lead has a gold plated layer having a thickness of at least 0.1 $\mu$m on a surface of said lead.

26. A method of manufacturing a semiconductor device according to claim 14, wherein said externally connecting member is made of a solder ball.

27. A method of manufacturing a semiconductor device according to claim 14, wherein said semiconductor device is any one of a device mounting a plurality of semiconductor chips and a device mounting active elements selected from the group consisting of resistors, capacitors, and inductors in addition to a semiconductor chip.

28. A method of manufacturing a semiconductor device according to claim 14, wherein said lead bridging across said hole is supported at both ends by the insulator tape.

* * * * *